United States Patent
Tang

(10) Patent No.: US 8,584,737 B2
(45) Date of Patent: Nov. 19, 2013

(54) HEAT DISSIPATION DEVICE WITH PARALLEL AND PERPENDICULAR FINS

(75) Inventor: Xian-Xiu Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 985 days.

(21) Appl. No.: 12/649,299

(22) Filed: Dec. 29, 2009

(65) Prior Publication Data

US 2011/0100609 A1 May 5, 2011

(30) Foreign Application Priority Data

Oct. 29, 2009 (CN) .......................... 2009 1 0309053

(51) Int. Cl.
*F28F 7/00* (2006.01)
*H05K 7/20* (2006.01)

(52) U.S. Cl.
USPC ........................................ 165/80.3; 361/700

(58) Field of Classification Search
USPC ...................................................... 165/80.3
See application file for complete search history.

(56) References Cited

U.S. PATENT DOCUMENTS

| 6,206,087 | B1* | 3/2001 | Nakase et al. | 165/80.3 |
|---|---|---|---|---|
| 6,542,364 | B2* | 4/2003 | Lai et al. | 361/697 |
| 7,100,681 | B1* | 9/2006 | Wu et al. | 165/104.33 |
| 7,228,889 | B1* | 6/2007 | Tian et al. | 165/122 |
| 7,647,960 | B2* | 1/2010 | Peng et al. | 165/80.3 |
| 8,322,404 | B2* | 12/2012 | Lian et al. | 165/80.3 |
| 8,322,405 | B2* | 12/2012 | Tang et al. | 165/80.3 |
| 2004/0196632 | A1* | 10/2004 | Chen et al. | 361/697 |
| 2005/0207124 | A1* | 9/2005 | Ohnishi et al. | 361/719 |
| 2007/0181287 | A1* | 8/2007 | Peng et al. | 165/80.3 |
| 2008/0236798 | A1* | 10/2008 | Zheng et al. | 165/104.33 |
| 2008/0316705 | A1* | 12/2008 | Cao et al. | 361/697 |

* cited by examiner

*Primary Examiner* — Brandon M Rosati
(74) *Attorney, Agent, or Firm* — Altis & Wispro Law Group, Inc.

(57) ABSTRACT

A heat dissipation device includes a heat pipe, a first fin unit, a second fin unit, and a centrifugal fan arranged on the first fin unit for drawing air from the first fin unit to the second fin unit. The heat pipe includes an evaporation section, a first condensing section and a second condensing section. The first fin unit includes a plurality of stacked first fins with a first channel defined between adjacent first fins. A notch is defined in the first fin unit receiving the evaporation section, and a canal is defined in the first fin unit receiving the first condensing section of the heat pipe. The second channel includes a plurality of stacked second fins. A second channel is defined between adjacent second fins perpendicular to the first channels. A passage is defined in the second fin unit receiving the second condensing section of the heat pipe.

10 Claims, 3 Drawing Sheets

HEAT DISSIPATION DEVICE WITH PARALLEL AND PERPENDICULAR FINS

BACKGROUND

1. Technical Field

The present disclosure relates to computer servers, and more particularly to a heat dissipation device of a computer server.

2. Description of Related Art

A server is a stand-alone computer and accommodates a plurality of electronic components such as processors, RAM, fixed disks, AC to DC power supplies therein. As the server contains these electronic components, a large amount of heat is generated during operation of the server. However, for a standard 1U server, a height of the server is just 1.75 inches. Conventional heat dissipation devices which are constructed by fin-type heat sinks and axial fans arranged on the heat sinks are much higher than 1.75 inches, and thus are impossible to be accommodated in the server for heat dissipating.

What is need, therefore, is a heat dissipation device which can overcome the above limitations.

DETAILED DESCRIPTION

Figure 1:
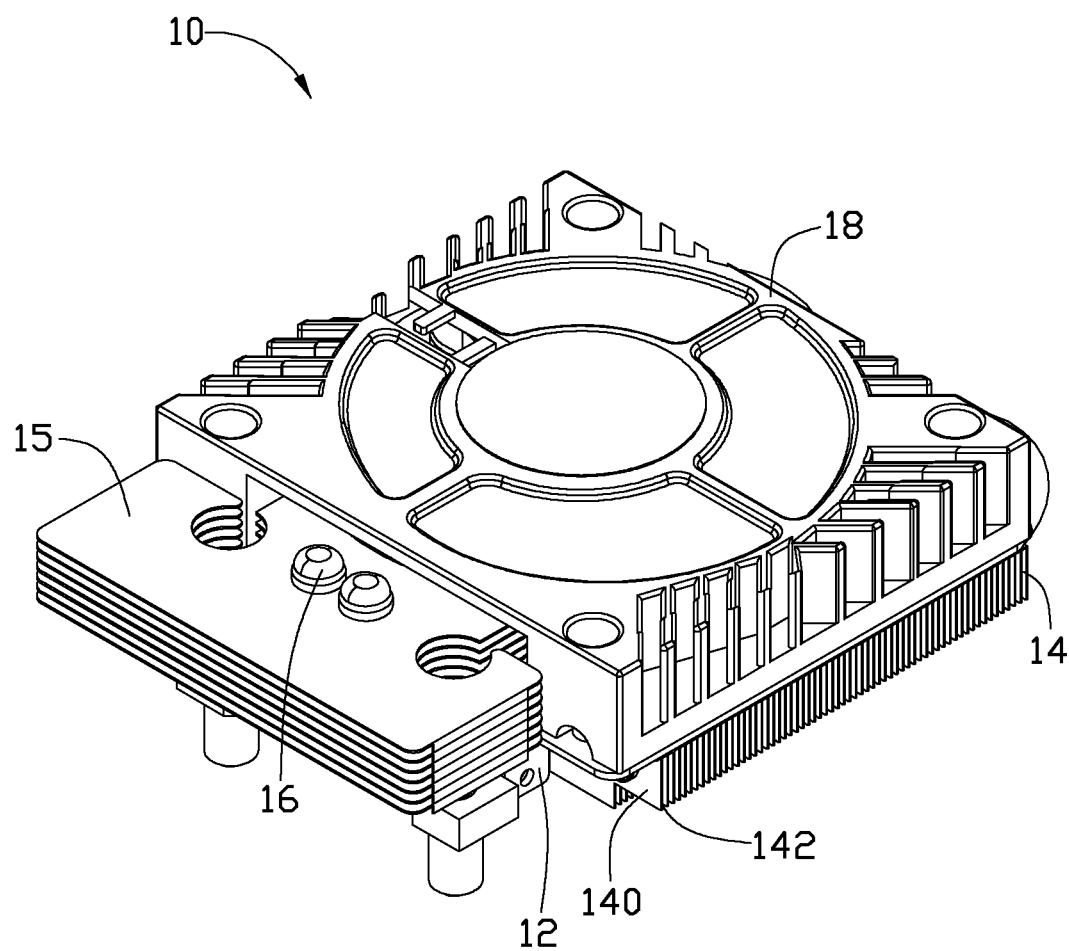
FIG. 1 is an isometric, assembled view of a heat dissipation device according to an exemplary embodiment.

Referring to FIG. 1, a heat dissipation device 10 according to an exemplary embodiment includes a substrate 12, a first fin unit 14, a second fin unit 15, a pair of heat pipes 16, and a centrifugal fan 18.

Figure 2:
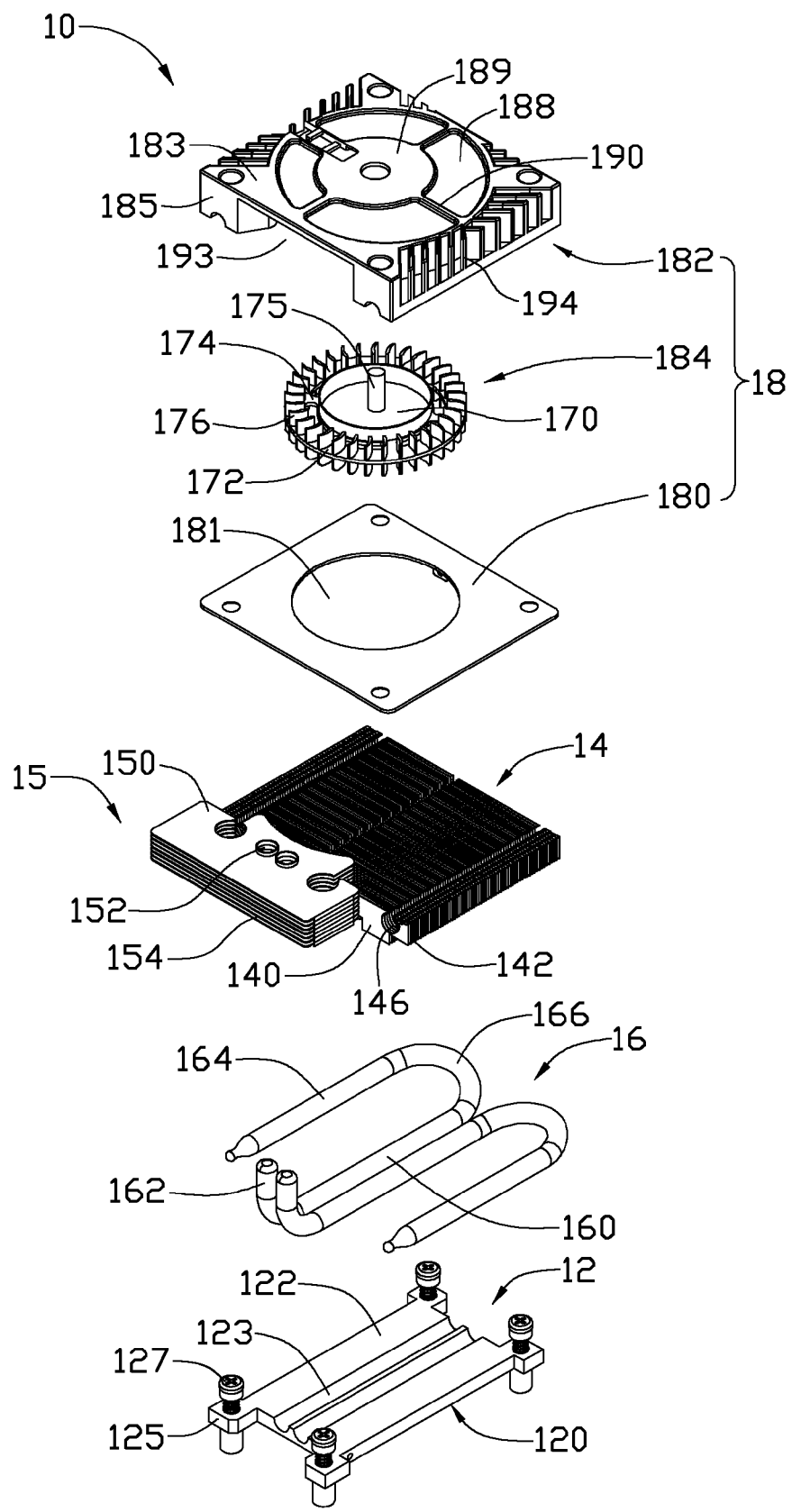
FIG. 2 is an exploded view of the heat dissipation device of FIG. 1.
Figure 3:
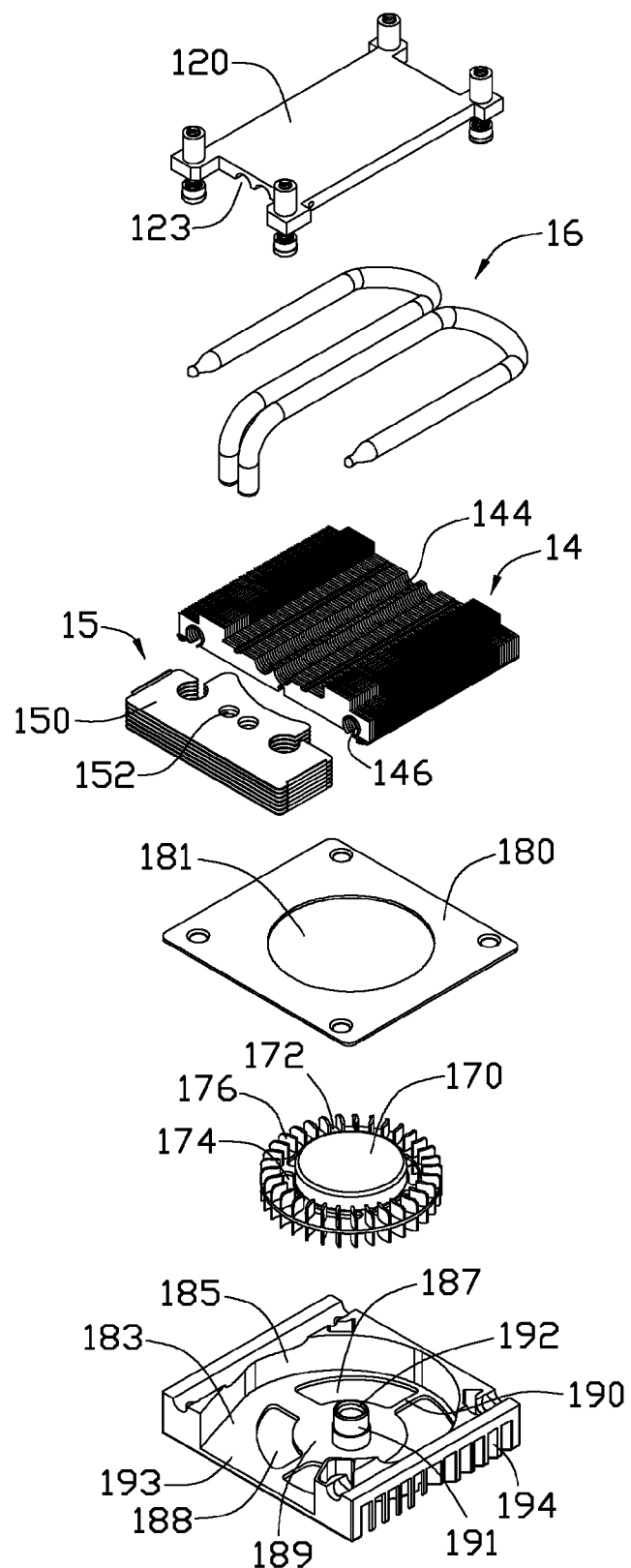
FIG. 3 is an inverted view of FIG. 2.

Referring to FIGS. 2 and 3, the substrate 12 is rectangular and flat. The substrate 12 includes a planar bottom face 120 configured for contacting a heat generating component (not shown), and a top face 122 opposite to the bottom face 120. A fixing portion 125 extends outwards from each corner of the substrate 12 for extension of a screw 127 therethrough to assemble the heat dissipation device 10 onto the heat generating component. A pair of grooves 123 is defined in the top face 122 of the substrate 12. The grooves 123 are straight and parallel to each other, and formed at a middle portion of the substrate 12. The grooves 123 extend through the base wall 180 along a longitudinal direction of the base wall 180. A cross section of each groove 123 is semi-circular.

The heat pipes 16 are identical, with each heat pipe 16 including an evaporation section 160, a first condensing section 164, a connecting section 166, and a second condensing section 162. The evaporation section 160 is straight. A length of the evaporation section 160 is substantially the same as a length of each groove 123 of the substrate 12. The first condensing section 164 is straight, and is arranged parallel to the evaporation section 160. The connecting section 166 and the second condensing section 162 are arranged at opposite sides of the evaporation section 160. The connecting section 166 is curved, and interconnects ends of the first condensing section 164 and the evaporation section 160. The second condensing section 162 extends upwards and perpendicularly from the evaporation section 160. A top end of the second condensing section 162 is higher than the first condensing section 164, and the first condensing section 164 is higher than the evaporation section 160.

The first fin unit 14 is arranged on the top face 122 of the substrate 12, and includes a plurality of first fins 140 spacedly stacked in parallel along the longitudinal direction of the substrate 12. A first channel 142 is defined between any two neighboring 172 first fins 140. The first channels 142 are perpendicular to the grooves 123 of the substrate 12.

A pair of notches 144 are defined at a middle of a bottom side of the first fin unit 14 corresponding to the pair of grooves 123 of the substrate 12. Each of the notches 144 is semi-circular. When assembled, each notch 144 of the first fin unit 14 and a corresponding groove 123 of the substrate 12 define a receiving groove for receiving the evaporation section 160 of the heat pipe 16 therein. A pair of canals 146 is formed at a top side of the first fin unit 14 for receiving the first condensing sections 164 of the heat pipes 16 therein, respectively. Each of the pair of canals 146 is located adjacent to a lateral side of the first fin unit 14. The canals 146 are parallel to the notches 144, and are located at opposite sides of the notches 144.

The second fin unit 15 is arranged adjacent to the first fin unit 14. The second fin unit 15 includes a plurality of second fins 150 stacked from bottom to top. Each second fin 150 is parallel to the substrate 12, but is perpendicular to the first fin 140. A second channel 154 is defined between any adjacent two second fins 150. The second channels 154 of the second fin unit 15 are perpendicular to the first channels 142 of the first fin unit 14. A pair of passages 152 extends through the second fin unit 15 from bottom to top for receiving the second condensing sections 162 of the heat pipes 16, respectively.

The centrifugal fan 18 includes a base wall 180, a cover 182, and an impeller 184. The base wall 180 and the cover 182 may be made of a metal material having a high heat transfer coefficient, such as aluminum. The base wall 180 is arranged on a top side of the first fin unit 14, and the cover 182 is fixed on the base wall 180. A space 187 is defined between the base wall 180 and the cover 182 receiving the impeller 184 therein. An air inlet 181 is defined in a central portion of the base wall 180 to allow airflow into the centrifugal fan 18.

The cover 182 includes a top wall 183 and an annular wall 185 extending down from an outer periphery of the top wall 183 to the base wall 180. An opening 188 is defined in a central portion of the top wall 183 and functions as another air inlet for the centrifugal fan 18. An air outlet 193 is defined in the annular wall 185, and is perpendicular to the air inlet 181 of the base wall 180 and the opening 188 of the top wall 183. When assembled, the centrifugal fan 18 is arranged with the air outlet 193 thereof facing the second fin unit 15, and the air inlet 181 facing the first fin unit 14. A plurality of assistant fins 194 extend radially from an outer side of the annular wall 185 of the cover 182.

A supporting wall 189 is arranged in the opening 188 of the top wall 183. A plurality of ribs 190 extends from the supporting wall 189 to an inner periphery of the top wall 183 to fix the supporting wall 189 to the top wall 183 of the cover 182. The supporting wall 189 is circular. A sleeve 191 extends perpendicularly from a central portion of the tube to the base wall 180. A bearing 192 is received in the sleeve 191.

The impeller 184 includes a hub 170, a shaft 175 extending from the hub 170 into the bearing 192, and a plurality of blades 176 surrounding the hub 170. An annular ring 172 is arranged around the hub 170 and interconnects middle portions of the blades 176. A number of poles 174 extend outwards from the hub 170 to connect the annular ring 172. Thus the blades 176 are fixed with the hub 170 and can rotate with the hub 170 to generate forced airflow.

During operation of the heat dissipation device 10, the bottom face 120 of the substrate 12 is arranged on the heat generating component to absorb heat therefrom. The first fin unit 14 is arranged on the top face 122 of the substrate 12. Cooperatively the grooves 123 of the substrate 12 and the notches 144 of the first fin unit 14 receive the evaporation sections 160 of the heat pipes 16, respectively. The first condensing sections 164 of the heat pipes 16 are respectively fixed in the canals 146 of the first fin unit 14, and the second condensing sections 162 of the heat pipes 16 are respectively fixed in the passages 152 of the second fin unit 15. Thus, the heat pipes 16, the first fin unit 14, the second fin unit 15, and the substrate 12 are closely combined together. Heat of the heat generating component thus can be quickly transferred to the first fin unit 14 and the second unit by the heat pipes 16.

When the centrifugal fan 18 operates to absorb surrounding air into the space 187 via both the opening 188 of the top wall 183 and the air inlet 181 of the base wall 180, forced airflow is formed in the first channels 142 of the first fin unit 14. Accordingly, the heat of the heat generating component transferred to the first fin unit 14 is taken away. Since there are assistant fins 194 formed on the annular wall 185 of the cover 182, the airflow through the space 187 of the centrifugal fan 18 is cooled by the assistant fins 194, and thus air flowing out of the air outlet 193 to the second fin unit 15 can cool the second fin unit 15 efficiently. Therefore, the airflow of the centrifugal fan 18 can take away the heat from both the first fin unit 14 and the second fin unit 15 timely. Accordingly, the heat generating device can be kept at safe temperatures. In addition, the second fin unit 15 is arranged at a lateral side of the centrifugal fan 18 for enhancing a heat dissipation efficiency of the heat dissipation device 10. Thus, the heat dissipation device 10 can still have a relatively smaller height. Accordingly, the heat dissipation device 10 can be accommodated in the thin electronic devices, such as 1U severs.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device, comprising:
    a substrate;
    a first fin unit arranged on the substrate, the first fin unit comprising a plurality of stacked first fins;
    a second fin unit comprising a plurality of stacked second fins;
    wherein the first fins are perpendicular to the second fins;
    a pair of heat pipes;
    each heat pipe comprising an evaporation section contacting the substrate, a first condensing section attaching to the first fins, and a second condensing section attaching to the second fins;
    wherein the first condensing section is parallel to the evaporating section, and the heat pipe further comprises a curved connecting section between the first condensing section and the evaporation section;
    the second condensing section is perpendicular to the evaporation section;
    a top end of the second condensing section is higher than the first condensing section, and the first condensing section is higher than the evaporation section;
    and
    a centrifugal fan arranged on the first fin unit, the centrifugal fan comprising an air inlet and an air outlet perpendicular to the air inlet, the air inlet facing the first fin unit, the air outlet facing the second fin unit, the centrifugal fan further comprising a base wall, a top wall, an annular wall between the base wall and the top wall, and an impeller, the base wall, the top wall and the annular wall cooperatively defining a space for receiving the impeller therein, the impeller comprising a hub, a plurality of blades surrounding the hub, an annular ring arranged around the hub and interconnecting middle portions of the blades, and a plurality of poles extending outward from the hub and connected to the annular ring.

2. The heat dissipation device of claim 1, wherein the first fins are perpendicular to the substrate, and the second fins are parallel to the substrate.

3. The heat dissipation device of claim 1, wherein the substrate defines a groove, the first fin unit defines a notch corresponding to the groove, and the groove and the notch cooperatively form a receiving groove accommodating the evaporation section of the heat pipe therein.

4. The heat dissipation device of claim 1, wherein a canal is defined in the first fin unit receiving the first condensing section, and a passage is defined in the second fin unit receiving the second condensing section, the canal being perpendicular to the passage.

5. The heat dissipation device of claim 1, wherein the centrifugal fan further comprises a plurality of assistant fins extending radially from an outer side of the annular wall for cooling airflow through the space of the centrifugal fan.

6. The heat dissipation device of claim 5, wherein the base wall, the top wall, and the annular wall are metal.

7. The heat dissipation device of claim 6, wherein an opening is defined in a central portion of the top wall and functions as another air inlet for the centrifugal fan.

8. The heat dissipation device of claim 7, wherein a supporting wall is arranged in the opening of the top wall, a plurality of ribs extending from the supporting wall to an inner periphery of the top wall to fix the supporting wall to the top wall, a sleeve extending perpendicularly from a central portion of the supporting wall, and a bearing being received in the sleeve.

9. The heat dissipation device of claim 8, wherein the impeller further comprises a shaft extending from the hub into the bearing.

10. The heat dissipation device of claim 9, wherein the air inlet is defined in a central portion of the base wall, and the air outlet is defined in the annular wall.

* * * * *